United States Patent
Kaynak et al.

(10) Patent No.: US 8,745,466 B2
(45) Date of Patent: Jun. 3, 2014

(54) DETECTING DATA-WRITE ERRORS

(75) Inventors: Mustafa N. Kaynak, San Diego, CA (US); Alessandro Risso, San Diego, CA (US); Patrick R. Khayat, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 304 days.

(21) Appl. No.: 12/852,397

(22) Filed: Aug. 6, 2010

(65) Prior Publication Data

US 2012/0036395 A1 Feb. 9, 2012

(51) Int. Cl.
*G11C 29/00* (2006.01)

(52) U.S. Cl.
USPC .......................................................... 714/763

(58) Field of Classification Search
USPC ............................................ 714/752, 758, 763
See application file for complete search history.

(56) References Cited

U.S. PATENT DOCUMENTS

| | | | |
|---|---|---|---|
| 6,671,852 B1 * | 12/2003 | Ariel et al. | 714/793 |
| 6,961,891 B2 * | 11/2005 | Murillo | 714/763 |
| 7,647,467 B1 * | 1/2010 | Hutsell et al. | 711/170 |
| 7,996,748 B2 | 8/2011 | Griseta et al. | |
| 8,321,769 B1 | 11/2012 | Yeo et al. | |
| 2007/0044006 A1 | 2/2007 | Yang et al. | |
| 2007/0288833 A1 * | 12/2007 | Djurdjevic et al. | 714/784 |
| 2009/0003144 A1 | 1/2009 | Mallary et al. | |
| 2009/0327836 A1 * | 12/2009 | Shimizu | 714/758 |
| 2010/0017684 A1 * | 1/2010 | Yang | 714/773 |
| 2011/0214039 A1 * | 9/2011 | Steiner et al. | 714/797 |
| 2012/0030539 A1 * | 2/2012 | Graef et al. | 714/758 |

OTHER PUBLICATIONS

"Density Multiplication and Improved Lithography by Directed Block Copolymer Assembly for Patterned Media at 1Tbit/in2 and Beyond"at www.hitachigst.com, white paper, pp. 3.

Jack K. Wolf, "On Codes Derivable from the Tensor Product of Check Matrices", IEEE Transactions on Information Theory, vol. 8, pp. 281-284, Apr. 1965.

Jack K. Wolf and B. Elspas, "Error-locating codes—A new concept in error control", IEEE Transactions on Information Theory, vol. IT-9, pp. 113-117, Apr. 1963.

Jack K. Wolf, "On an extended class of error-locating codes", Information and Control, vol. 8, pp. 163-169, Apr. 1965.

Panu Chaichanavong and Paul H. Siegel, "Tensor-product parity code for magnetic recording", IEEE Transactions on Magnetics, vol. 42, No. 2, pp. 350-352, Feb. 2006.

Panu Chaichanavong and Paul H. Siegel, "Tensor-product parity codes: Combination with constrained codes and application to perpendicular recording", IEEE Transactions on Magnetics, vol. 42, No. pp. 214-219, Feb. 2006.

Jack K. Wolf, "An Introduction to Tensor Product Codes and Applications to Digital Storage Systems", in Proceedings of 2006 IEEE Information Theory Workshop (ITW'06), pp. 6-10, 2006.

Hideki Imai and Hiroshi Fujiya, "Generalized tensor product codes", IEEE Transactions on Information Theory, vol. IT-27, No. 2, pp. 181-187, Mar. 1981.

* cited by examiner

*Primary Examiner* — Scott Baderman
*Assistant Examiner* — Joseph Kudirka
(74) *Attorney, Agent, or Firm* — Graybeal Jackson LLP

(57) ABSTRACT

An embodiment of a data read path includes recovery and decoder circuits. The recovery circuit is operable to recover coded data from a storage medium, and the decoder circuit is operable to detect, in the recovered data, a write error that occurred during a writing of the coded data to the storage medium. For example, such an embodiment may allow detection of a write error that occurred while writing data to a bit-patterned storage medium.

38 Claims, 6 Drawing Sheets

DETECTING DATA-WRITE ERRORS

RELATED APPLICATION DATA

This application is related to U.S. patent application Ser. No. 12/852,368, entitled RENDERING DATA-WRITE ERRORS DETECTABLE filed Aug. 6, 2010, and which is incorporated herein by reference in its entirety.

SUMMARY

An embodiment of a data-write path includes encoder and write circuits. The encoder circuit is operable to code data so as to render detectable a write error that occurs during a writing of the coded data to a storage medium, and the write circuit is operable to write the coded data to the storage medium.

For example, such an embodiment may allow rendering detectable a write error that occurs while writing data to a bit-patterned storage medium.

An embodiment of a data-read path includes recovery and decoder circuits. The recovery circuit is operable to recover coded data from a storage medium, and the decoder circuit is operable to detect, in the recovered data, a write error that occurred during a writing of the coded data to the storage medium.

For example, such an embodiment may allow detection of a write error that occurred while writing data to a bit-patterned storage medium.

DETAILED DESCRIPTION

Manufacturers of data-storage media are continually attempting to increase the data-storage density (e.g., bits/$cm^2$) of such media so that manufacturers of data-storage media drives (e.g., magnetic hard-disk drives) may increase the data-storage capacities of such drives.

Figure 1:
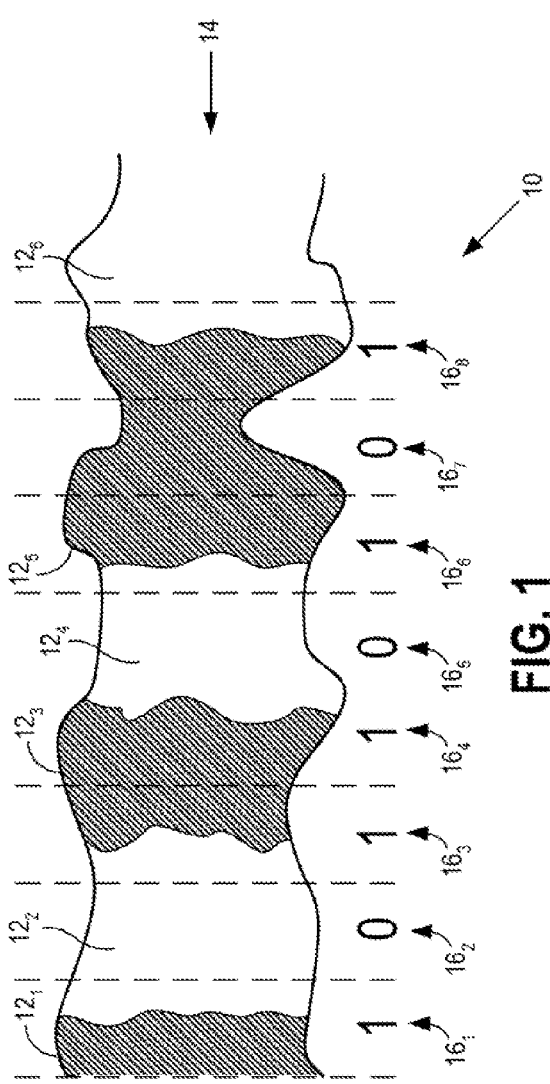
FIG. 1 is a partial plan view of an embodiment of an unpatterned magnetic storage medium.

FIG. 1 is a partial plan view of an embodiment of an unpatterned magnetic data-storage medium 10, from which may be formed, e.g., a magnetic storage disk of a hard-disk drive.

The medium 10 includes tiny grains (not shown in FIG. 1) of material that may be magnetized according to one of two magnetic-field polarities (the magnetic fields may be vertically or horizontally oriented).

To write data to the medium 10, a write head (not shown in FIG. 1) magnetizes areas $12_1$-$12_6$ of these grains to form a data track 14 (only partially shown in FIG. 1), which includes data-element regions $16_1$-$16_8$—in the illustrated example, each data-element region stores a bit of data. If a boundary between two contiguous areas 12 lies within a region 16, then this region stores a logic 1. Conversely, if only a single area 12 or portion thereof lies within a region 16, then this region stores a logic 0. Consequently, according to this convention, the data-bit regions $16_1$-$16_8$ store the following binary data sequence: 10110101.

Figure 2:
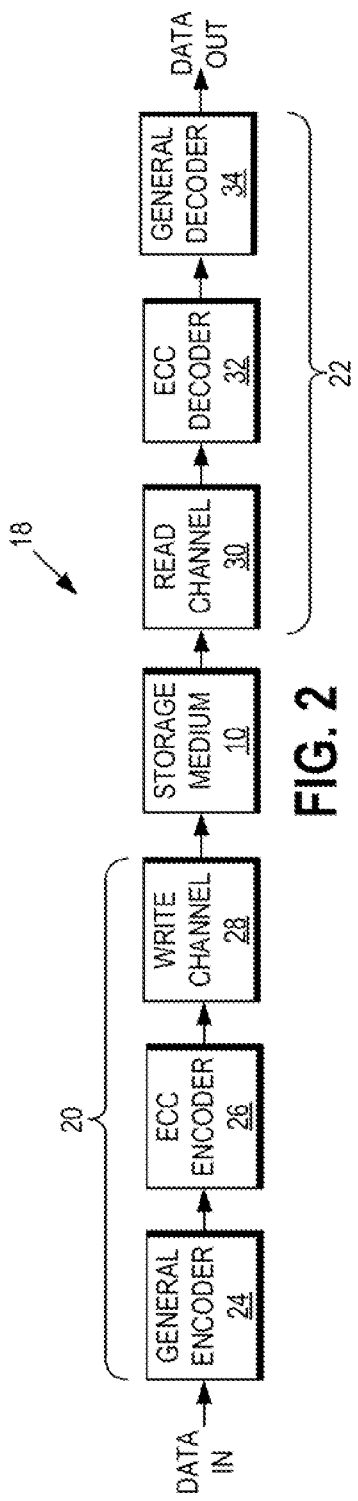
FIG. 2 is a block diagram of an embodiment of a data path that includes the unpatterned storage medium of FIG. 1 and that is operable to write data to and read data from the storage medium.

FIG. 2 is a block diagram of an embodiment of a data path 18 which includes the medium 10 of FIG. 1, and which may write data to, and read the written data from, the medium.

In addition to the data-storage medium 10, the data path 18 includes a data-write path 20 for writing data to the storage medium, and a data-read path 22 for reading data from the storage medium.

The data-write path 20 includes a general encoder 24, an error-correction-code (ECC) encoder 26, and a write channel 28, and the read path 22 includes a read channel 30, an ECC decoder 32, and a general decoder 34.

The general encoder 24 receives an input data sequence, and encodes the data, for example, to compress the data and thus to increase the storage capacity of the medium 10.

The ECC encoder 26 encodes the data from the general encoder 24 such that read errors (e.g., noise and inter-symbol interference) introduced into the read data by the storage medium 10 or the read channel 30 may be detected, located, and corrected.

And the write channel 28 includes, for example, a digital-to-analog converter, a low-noise pre-amplifier, and a read-write head (none of which is shown in FIG. 2) for respectively converting the coded data from the ECC encoder 26 into an analog signal, driving the read-write head with the analog signal, and writing the coded data to the storage medium 10 (FIG. 1) by appropriately magnetizing the areas 12 of the storage medium.

Still referring to FIG. 2, the read channel 30 includes, for example, the read-write head, a low-noise amplifier, an analog-to-digital converter (ADC), an equalizer, a timing-recovery loop, a head-alignment loop, and a data-recovery circuit (also called a channel detector), such as a Viterbi detector or maximum-a-posteriori (MAP) detector (none of which is shown in FIG. 2). The read-write head converts the magnetic fields generated by the magnetized media areas 12 (FIG. 1) into an analog signal, and the amplifier provides this signal to the ADC for converting into a digital (e.g., binary) signal. The equalizer shapes the digital signal according to a target polynomial (e.g., PR4, EPR4, E2PR4) of the read channel 30, and the timing-recovery loop effectively synchronizes a sample clock (not shown in FIG. 2), with the bit regions 16 (FIG. 1), where the sample clock clocks the ADC. The head-alignment loop aligns the read-write head with the track 14, and the data-recovery circuit generates a sequence of recovered data bits. If the data-recovery circuit is a "soft" recovery circuit, then it may also generate for each recovered data bit an error-probability value (e.g., a log-likelihood ratio (LLR)) that indicates a probability that the value of the data bit is accurate.

The ECC decoder 32 decodes the recovered data bits from the read channel 30 according to a decoding algorithm that corresponds to the encoding algorithm implemented by the ECC encoder 26. If the ECC decoder 32 detects an error in the recovered data bits, then it may attempt to correct the error. If the correction attempt is unsuccessful, then the ECC decoder 32 may request that the read channel 30 re-read the portion of the storage medium 10 that includes the erroneously recovered data.

The general decoder 34 decodes the data from the ECC decoder 32 according to a decoding algorithm that corresponds to the encoding algorithm implemented by the general encoder 24. For example, the general decoder 34 may decompress the data from the ECC decoder 32.

Referring to FIGS. 1 and 2, the data path 18 includes no components for handling write errors that may be introduced into the data by the write channel 28 while writing the data to the media 10.

One reason for this is because the track 14 is effectively a "blank slate" for the write channel 28; that is, the track locations in which the write channel generates the magnetized areas 12 are, by convention, the correct locations. As stated above, it is up to the read-channel 30 to effectively generate the bit regions 16 in proper alignment with the areas 12.

Consequently, the data-path 18 may be designed with the assumption that there exist no data-write errors, only data-read errors (e.g., errors due to noise and inter-symbol interference).

Figure 3:
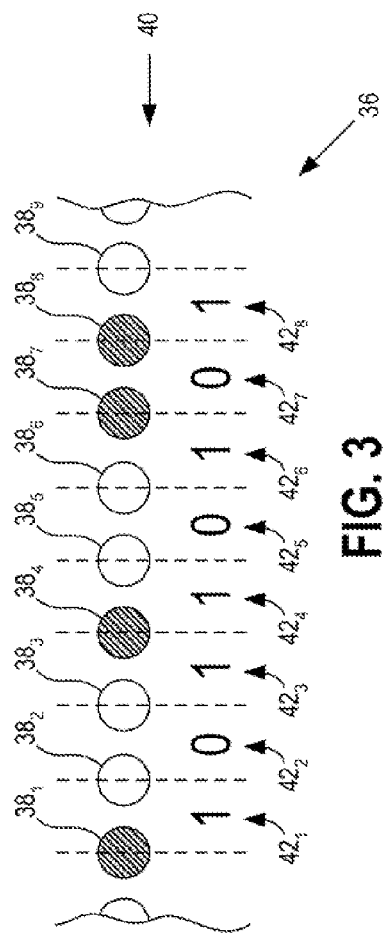
FIG. 3 is a partial plan view of an embodiment of a patterned magnetic storage medium.

FIG. 3 is a partial plan view of an embodiment of a patterned magnetic data-storage medium 36, from which may be formed, e.g., a magnetic storage disk of a hard-disk drive.

The medium 36 includes "islands" 38 of material that may be magnetized according to one of two magnetic-field polarities. If the islands 38 are smaller than the magnetized areas 12 of the unpatterned medium 10 (FIG. 1), then the patterned medium 36 may have a higher data-storage density (e.g., two to ten times higher) than the unpatterned medium.

To write data to the medium 36, a read-write head (not shown in FIG. 3) magnetizes islands 38, e.g., islands $38_1$-$38_9$, to form a data track 40 (only partially shown in FIG. 3), which includes corresponding data-element regions $42_1$-$42_8$—in the illustrated example, each data-element region stores a bit of data, and, therefore, the medium 36 may be called a bit-patterned media (BPM). If there is a transition in the magnetic-field polarity from one island 38 to another island within a data-bit region 42, then this data-bit region stores a logic 1. Conversely, if there is no transition in the magnetic-field polarity from one island 38 to another island within a data-bit region 42, then this data-bit region stores a logic 0. Consequently, according to this convention, the data-bit regions $42_1$-$42_8$ store the following binary data sequence: 10110101.

Because the read-write head (not shown in FIG. 3) magnetizes predisposed islands 38, and does not have the freedom to define the locations of these islands (as it has the freedom to define the locations of the magnetized regions 12 of the medium 10 in FIG. 1), a write error may be introduced into the written data if, for example, the read-write head is misaligned with an island while attempting to change the magnetic-field polarity of the island.

Figure 4:
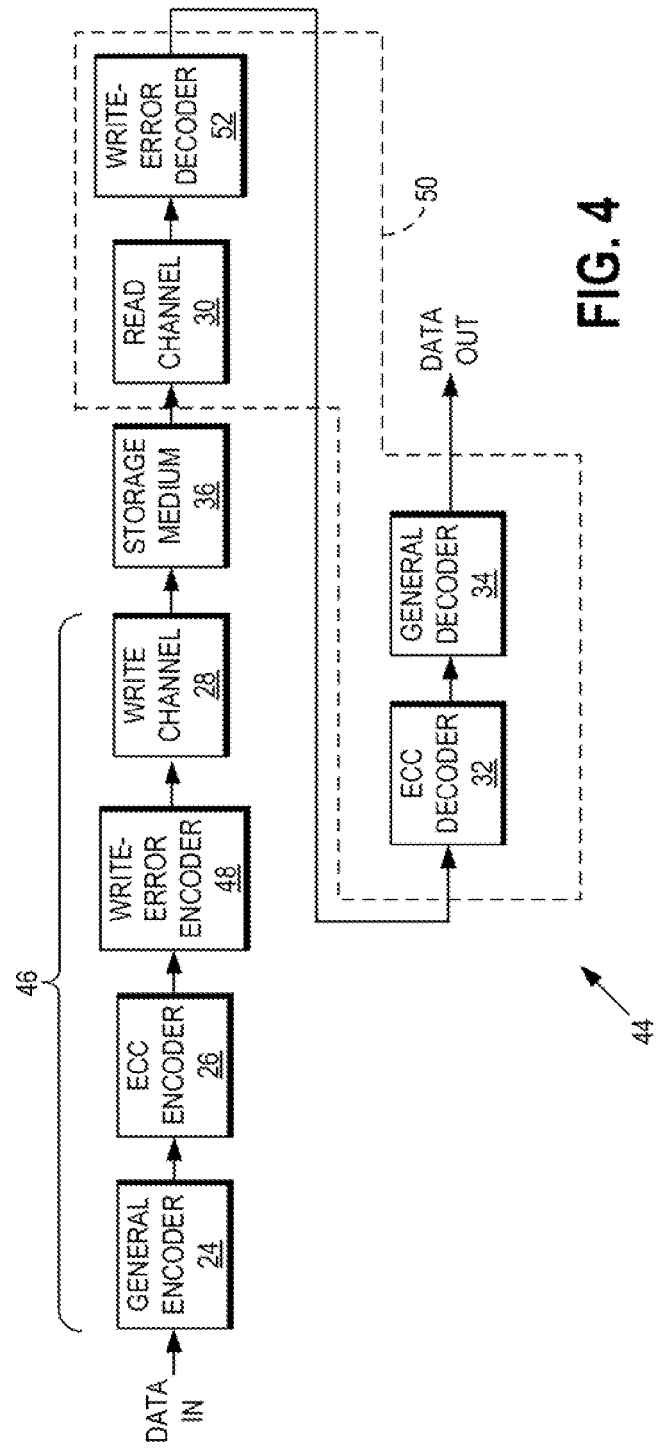
FIG. 4 is a block diagram of an embodiment of a data path that includes the patterned storage medium of FIG. 1 and that is operable to write data to and read data from the storage medium.

FIG. 4 is a block diagram of an embodiment of a data path 44 which includes the storage medium 36 of FIG. 1, and which may write data to, and read the written data from, the medium so as to account for potential write errors in the stored data. In FIG. 4, like numbers are used to reference components common to the data path 18 of FIG. 2.

The data path 44 is similar to the data path 18 (FIG. 2), except that it includes the storage medium 36, a write path 46 having a write-in error detection code encoder (hereinafter a write-in error encoder) 48 located between the ECC encoder 26 and write channel 28, and a read path 50 having a write-in error detection code decoder (hereinafter a write-in error decoder) 52 located between the read channel 30 and the ECC decoder 32.

The write-in error encoder 48 codes the data from the ECC encoder 26 so as to render a write error at least detectable, and the write-in error decoder 52 decodes the read data so as to at least detect the write error. In response to the write-in error decoder 52 detecting the write error, the read path 50 may take action such as to instruct the read channel 30 to re-read the portion of the storage medium 36 that contains the erroneously written data.

Alternatively, the write-in error encoder 48 may code the data from the ECC encoder 26 so as to render a write error locatable, or even correctable, and the write-in error decoder 52 may decode the recovered data so as to indicate the location of the write error, or even to correct the write error.

Although the write-in error encoder 48 may use any suitable code or coding scheme to code the data, in an embodiment the write-in error encoder uses a tensor-product code (TPC), which is a code formed from the tensor product of two or more constituent codes (C), such as, e.g., a single parity check code and a Hamming code. The error-handling properties of the constituent codes determine the error-handling properties of the resulting tensor-product code. For example, where a tensor-product code is formed form two constituent codes, the possible error-handling properties of the tensor-product code are given in TABLE I.

TABLE I

| First Constituent Code (C1) | Second Constituent Code (C2) | Resulting Tensor-Product Code (TPC) |
| --- | --- | --- |
| Enables only error detection | Enables only error detection | Enables only detection of a write error |
| Enables only error detection | Enables error detection, error locating, and error correction | Enables detection and locating of a write-error |
| Enables error detection, error locating, and error correction | Enables only error detection | Enables detection and locating of a write-error |
| Enables error detection, error locating, and error correction | Enables error detection, error locating, and error correction | Enables detection, locating, and correction of a write-error |

For example, according to the second row of TABLE I, if the first constituent code C1, used alone, enables only detection of an error in, for example, a code word, and if the second constituent code. C2, used alone, enables detection, locating, and correction of an error in, for example, a code word, then the resulting tensor-product code TPC enables the write-in error decoder 52 to detect and locate, but not correct, an error in, for example, a code word. But, as discussed below, even if the write-error decoder 52 only detects a write error, this may be sufficient to allow, e.g., the ECC decoder 32 to correct the detected write error.

An example of the write-error encoder 48 is discussed for a tensor-product code that allows error detection and error locating, but that does not allow error correcting, per the second row of the TABLE I.

In this example, the tensor-product code is formed as a product of a rate 4/5 single-parity code C1 (code word has 4 data bits, 1 parity bit, 5 total bits) and a rate 4/7 Hamming code C2 (code word has 4 data bits, 3 code bits, 7 total bits), where the respective parity-check matrices H(C1) and H(C2) and generator matrices G(C1) and G(C2) for C1 and C2 are as follows:

$$H(C1) = [1 \quad 1 \quad 1 \quad 1 \quad 1] \quad (1)$$

$$G(C1) = \begin{bmatrix} 1 & 0 & 0 & 0 & 1 \\ 0 & 1 & 0 & 0 & 1 \\ 0 & 0 & 1 & 0 & 1 \\ 0 & 0 & 0 & 1 & 1 \end{bmatrix} \quad (2)$$

$$H(C2) = \begin{bmatrix} 1 & 1 & 1 & 0 & 1 & 0 & 0 \\ 1 & 1 & 0 & 1 & 0 & 1 & 0 \\ 1 & 0 & 1 & 1 & 0 & 0 & 1 \end{bmatrix} \quad (3)$$

$$G(C2) = \begin{bmatrix} 0 & 1 & 1 & 1 & 0 & 0 & 0 \\ 1 & 1 & 1 & 0 & 1 & 0 & 0 \\ 1 & 0 & 1 & 0 & 0 & 1 & 0 \\ 1 & 1 & 0 & 0 & 0 & 0 & 1 \end{bmatrix} \quad (4)$$

The parity-check matrix H(TPC)=TP[H(C1),H(C2)] for the example tensor-product code is obtained by multiplying each element of the matrix H(C2) by the vector H(C1) such that the resulting tensor-product code is a 32/35 code (code word has 32 data bits, 3 parity bits, 35 total bits). For example, the parity-check-matrix elements H(TPC)$_{1,1}$–H(TPC)$_{1,5}$=11111, and are obtained by multiplying H(C1)=11111 by H(C2)$_{1,1}$=1. Likewise, the parity-check-matrix elements H(TPC)$_{3,6}$–H(TPC)$_{3,10}$=00000, and are obtained by multiplying H(C1)=11111 by H(C2)$_{3,2}$=0. Consequently, the parity-check matrix H(TPC) is as follows:

$$H(TPC) = \begin{bmatrix} 11111 & 11111 & 11111 & 00000 & 11111 & 00000 & 00000 \\ 11111 & 11111 & 00000 & 11111 & 00000 & 11111 & 00000 \\ 11111 & 00000 & 11111 & 11111 & 00000 & 00000 & 11111 \end{bmatrix} \quad (5)$$

The write-in error encoder 48 generates a 35-bit code word by taking 32 bits of data and adding 3 parity bits to the data such that the product of the code word and the parity-check-matrix H(TPC) equals zero. Consequently, as discussed in more detail below, if the write-in error decoder 52 obtains a non-zero value for this product, then the write-in error decoder detects an error, and the nonzero value of the product vector may indicate the location of the error within the 35-bit code word.

The starting 32-bit data word may be represented as having data bits $B_{32}$-$B_1$, and the 35-bit code word, which may be parsed into seven 5-bit symbols Symbol 7-Symbol 1 as shown in TABLE II, includes the data bits $B_{32}$-$B_1$ plus parity bits $P_3$-$P_1$:

TABLE II

| Symbol 7 | Symbol 6 | Symbol 5 | Symbol 4 | Symbol 3 | Symbol 2 | Symbol 1 |
|---|---|---|---|---|---|---|
| $B_{32}$ | $B_{27}$ | $B_{22}$ | $B_{17}$ | $B_{12}$ | $B_8$ | $B_4$ |
| $B_{31}$ | $B_{26}$ | $B_{21}$ | $B_{16}$ | $B_{11}$ | $B_7$ | $B_3$ |
| $B_{30}$ | $B_{25}$ | $B_{20}$ | $B_{15}$ | $B_{10}$ | $B_6$ | $B_2$ |
| $B_{29}$ | $B_{24}$ | $B_{19}$ | $B_{14}$ | $B_9$ | $B_5$ | $B_1$ |
| $B_{28}$ | $B_{23}$ | $B_{18}$ | $B_{13}$ | $P_3$ | $P_2$ | $P_1$ |

The write-in error encoder 48 calculates $P_3$-$P_1$ as follows. First, the write-in error encoder 48 calculates phantom syndromes $S_7$-$S_4$ for the symbols Symbol 7—Symbol 4, which do not include a parity bit—the syndromes are "phantom" syndromes because they used by the encoder to calculate the parity bits $P_3$-$P_1$, whereas a decoder calculates the syndromes from all of the symbols including the received parity bits. The phantom syndromes respectively equal the binary sum of the bits in each corresponding symbol. So, $S_7$ equals the sum of the bits $B_{32}$-$B_{28}$, $S_6$ equals the sum of the bits $B_{27}$-$B_{21}$, $S_6$ equals the sum of the bits $B_{22}$-$B_{18}$, and $S_4$ equals the sum of the bits $B_{17}$-$B_{13}$.

Next, the write-in error encoder 48 calculates the phantom syndromes $S_3$-$S_1$, as follows, where each of these syndromes equals the binary sum of the bits in the corresponding symbol Symbol 3-Symbol 1, which do include a parity bit. Consequently, $S_3$ equals the sum of the bits $B_{12}$-$B_9$ and $P_3$, $S_2$ equals the sum of the bits $B_8$-$B_5$ and $P_2$, and $S_1$ is the sum of the bits $B_4$-$B_1$ and $P_1$. But because $P_3$-$P_1$ are presently unknown, the write-error encoder 48 calculates $S_3$-$S_1$ according to the following equations:

$$S_3 = S_7 + S_6 + S_5 \quad (6)$$

$$S_2 = S_7 + S_6 + S_4 \quad (7)$$

$$S_1 = S_7 + S_5 + S_4 \quad (8)$$

Then, the write-error encoder 48 calculates $P_3$-$P_1$ according to the following equations:

$$P_3 = S_3 + B_9 + B_{10} + B_{11} + B_{12} \quad (9)$$

$$P_2 = S_2 + B_5 + B_6 + B_7 + B_8 \quad (10)$$

$$P_1 = S_1 + B_1 + B_2 + B_3 + B_4 \quad (11)$$

In a more specific example, assume that the 32-bit data word is 01011 11111 00011 11000 1010 1111 0000. Therefore, per equations (6)-(11), $P_3$=0, $P_2$=0, and $P_1$=1 such that the resulting 35-bit code word is 01011 11111 00011 11000 10100 11110 00001 (the parity bits P are highlighted). If one converts this 35-bit code word into a column vector and multiplies it by the parity-check matrix H(TPC) of equation (5), then the result is a 1×3 zero-valued vector [0 0 0] as expected. Furthermore, for known reasons that are omitted for brevity, one may reduce the complexity of this matrix multiplication by instead multiplying the phantom syndromes S7-S1, in column-vector form, by the parity-check matrix H(C2) of equation (3) to obtain the same 1×3 zero-valued vector [0 0 0].

Figure 5:
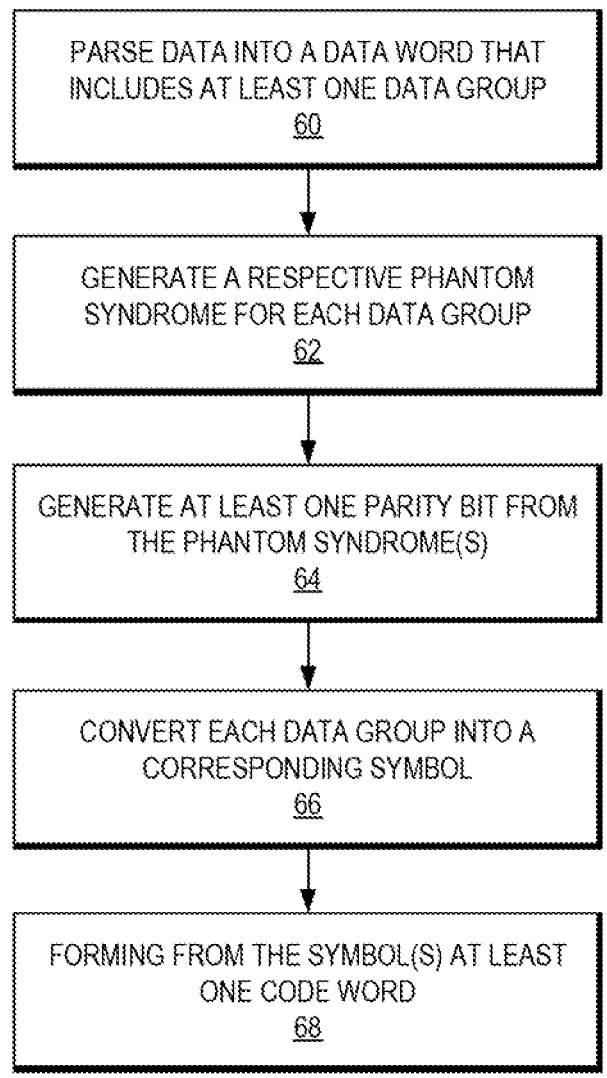
FIG. 5 is a flow diagram of an encoding operation performed by an embodiment of the write-in error detection code encoder of FIG. 4.

FIG. 5 is a flow diagram of an encoding operation performed by an embodiment of the write-in error encoder 48 of FIG. 4.

Starting at a step 60, the encoder 48 parses data from the ECC encoder. 26 into a data word that includes a least one data group, e.g., a 32-bit data word that includes four 5-bit groups and three 4-bit groups per the above example.

Next, at a step 62, the encoder 48 calculates a respective phantom syndrome S for each data group of the data word.

Then, at a step 64, the encoder 48 calculates from the phantom syndromes S at least one parity bit P, and, at a step 66, adds the at least one parity bit to at least one of the data groups to convert the data groups into respective symbols. For example, as discussed in the above example, the encoder 48 may generate three parity bits $P_3$-$P_1$, and add each of these bits to a respective 4-bit data group to form seven 5-bit symbols.

Next, at a step 68, the encoder 48 generates a code word from the at least one symbol. For example, as discussed in the above example, the encoder 48 may generate a 35-bit code word having seven 5-bit symbols.

Referring again to FIG. 4, an example of the write-in error decoder 52 is discussed for a tensor-product code, which allows error detection and locating, but which does not allow error correcting per the second row of TABLE I above. The code described above in conjunction with equations (1)-(11) is an example of such a code.

First, the write-in error decoder 52 receives from the read channel 30 a sequence of recovered data elements (e.g., data bits), and at least one respective indicator (e.g., a log-likelihood ratio LLR) for each element, where the indicator provides a measure of confidence on the recovered data bit. For example, where the indicator is an LLR, a smaller LLR in absolute value shows less confidence in the hard decision, and a higher LLR in absolute value shows a higher confidence. For purposes of explanation, the data elements are hereinafter discussed as being data bits, it being understood that the data elements may be other than binary elements. For example, in an embodiment, the read channel 30 may provide a stream of data bits having "soft" values, and, for example, an LLR for each bit indicating confidence on the decision. Alternatively, the read channel 30 may provide only a reliability indicator (e.g., an LLR) for each bit, because the information about the value of the bit may be fully contained within the reliability value. In yet another embodiment, the read channel 30 may provide a sequence of data bits having "hard" values with no reliability indicators; that is, the read channel 30 has assigned a value of logic 1 or logic 0 to each bit. For purposes of explanation, it is hereinafter assumed that the read channel 30 provides data bits having "soft" values, and also provide for each bit a respective LLR value that indicates the probability that the soft value assigned to the bit is correct. But the below-described techniques may be applicable, with little or no modification, to the other above-described alternatives for the read-channel output.

Next, the write-in error decoder 52 parses the data elements into code words (e.g., 35-bit code words) that have the same length as the code words generated by the write-error detection/location code encoder 48.

If the read channel 30 provides "soft" data bits per above, then, for each code word, the decoder 52 makes a "hard" decision for the value of each bit of the code word based on the LLR of that bit.

Next, the write-in error decoder 52 parses each code word into the same number of symbols as generated by the write-encoder 48 as discussed above, and assigns a respective soft-reliability value, e.g., to each symbol. For example, the decoder 52 may assign to each symbol the lowest of the bit reliability indicators (e.g., LLRs) for the bits within the symbol.

Then, the decoder 52 multiplies the code word by one of the code matrices to generate an error-locator matrix.

Alternatively, the decoder 52 may calculate a respective syndrome for each symbol, and multiply the syndrome vector by an error-locator matrix of reduced complexity to generate the error-locator matrix.

Next, the decoder 52 uses the error-locator matrix to determine whether there is an error (are errors) in the code word, and if so, uses the error-locator matrix also to determine the symbol(s) in which the error(s) is(are) located.

Then, the decoder 52 determines whether each of these errors is a write error. For example, if the reliability value for an erroneous symbol is higher than or equal to a threshold, then the decoder 52 determines that the error is a write error. A reason for this is that if the read-channel 30, which as described above is not constructed to detect write errors, indicates that the bits in the erroneous symbol have a relatively high reliability, then any error in the symbol is probably a write error, and not a read error (e.g., noise, inter-symbol interference) that the read channel is designed to detect. Conversely, if, for example, the symbol reliability value is lower than the threshold, then the decoder 52 determines that the error is not a write error. A reason for this is that if the read-channel 30, which as described above is constructed to detect read errors, indicates that the bits in the erroneous symbol have a relatively low reliability, then, any error in the symbol is probably a read error, and not a write error.

Next, if the decoder 52 determines that an error is a read error, then it does nothing more.

But if the decoder 52 determines that an error is a write error, then the decoder may correct the error if the tensor-product code allows, or may provide to the ECC decoder 32 information than may allow the ECC decoder to correct the error. For example, the decoder 52 may set the reliability value (e.g., LLR) for each bit in the erroneous symbol to a value such as zero (also called LLR erasing) so that the ECC decoder 32 will be more likely to recognize that this symbol contains an error, and thus will be more likely to attempt to correct it.

Still referring to FIG. 4, an example of a decoding operation performed by an embodiment of the write-in error decoder 52 is given using the example tensor-product code and example code word described above in conjunction with equations (1)-(11).

As described above, a 35-bit code word may be 01011 11111 00011 11000 10100 11110 00001.

Assume, however, that the write channel 28 wrote the code word such that the highlighted bit in the second symbol is erroneous: 01011 11111 00011 11000 10100 01110 00001.

The write-in error decoder 52 generates an error-locator vector [010] for this erroneous code word, either by multiplying the parity-check matrix H(TPC) of equation (5) by this erroneous code word in column-vector form, or by calculating the syndromes $S_6$-$S_1$=1100011 for this erroneous code word—the syndromes equal the respective binary sums of the bits in each symbol per above—and by multiplying the parity-check matrix H(C2) of equation (3) by the calculated syndromes in column-vector form.

Next, the decoder 52 converts the binary error-locator value 010 into decimal form, here, decimal 2, and this decimal number identifies the erroneous symbol, here Symbol 2.

Then, the decoder 52 sets the LLR for each bit in Symbol 2 to zero, and passes the erroneous code word and the modified LLRs (only the LLRs for the Symbol 2 are modified) to the ECC decoder 32 for further processing.

Of course, if the error-locator vector is [0 0 0], then this indicates that the code word contains no write/read errors.

Figure 6:
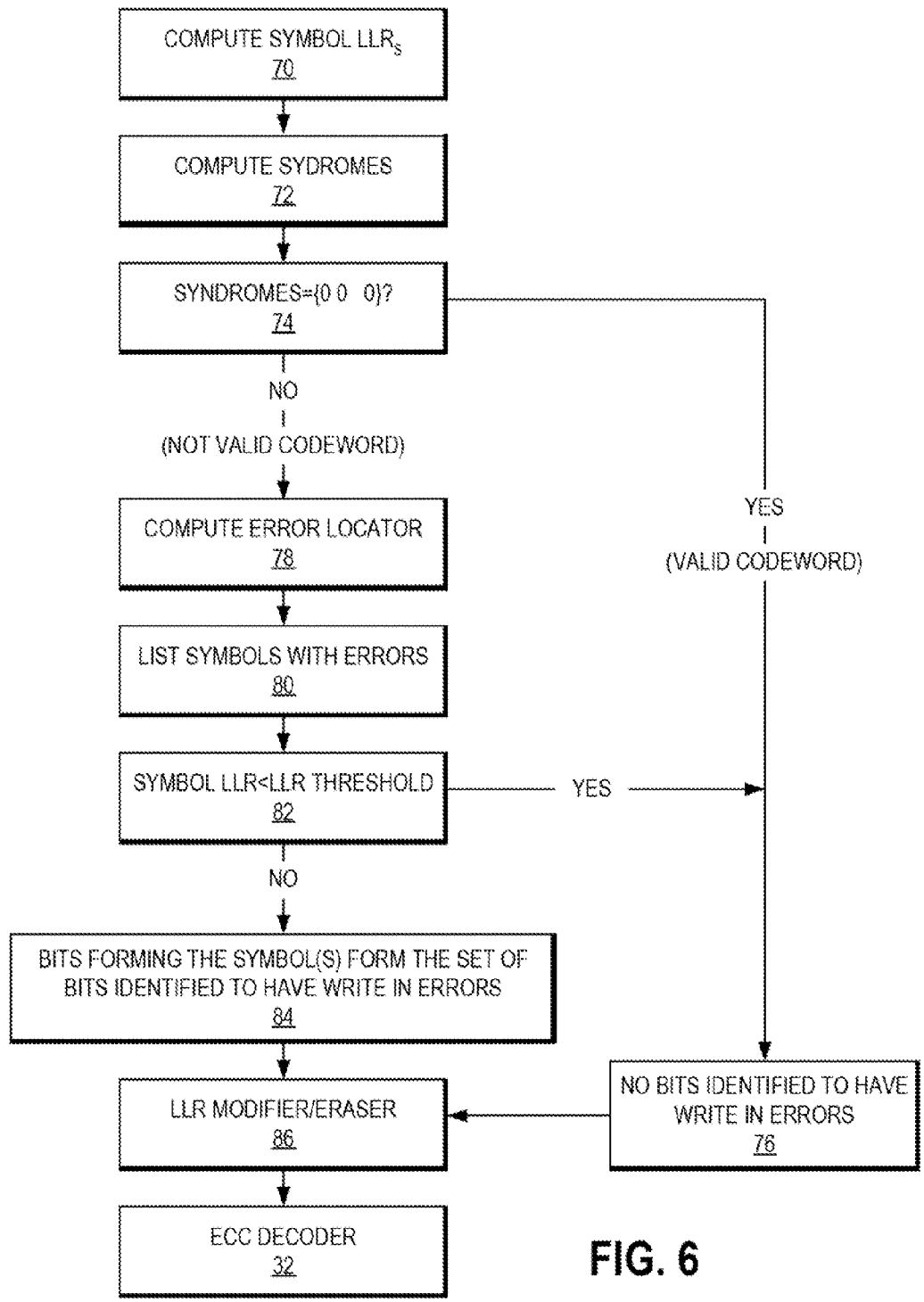
FIG. 6 is a flow diagram of a decoding operation performed by an embodiment of the write-in error detection code decoder of FIG. 4.

FIG. 6 is a flow diagram of a decoder operation performed by an embodiment of the write-in error decoder 52 of FIG. 4.

In a step 70, after parsing the code word into symbols, the write-in error decoder 52 computes a respective LLR for each symbol. For example, a symbol's LLR may be the lowest of the LLRs for the bits that compose the symbol.

In a step 72, the decoder 52 computes the syndromes from the symbols.

In a step 74, the decoder 52 determines whether the syndrome vector is zero.

In a step 76, if the syndrome vector is zero, then the decoder 52 identifies all bits of the code word as being correct, and also indicates that none of the LLRs for the bits in the code word are to be modified (e.g., the decoder performs no LLR erasure for this code word).

But in a step 78, if the syndrome vector is non zero, then the decoder 52 converts the vector into an error-locator.

In a step 80, the decoder 52 uses the error locator to identify the erroneous symbols.

In a step 82, the decoder 52 compares the LLR of each identified erroneous symbol to a threshold value. For each symbol having an LLR less than the threshold, the decoder 52, in the step 76, indicates that none of the LLRs for the bits in the symbol are to be modified. But for each symbol having an LLR greater than or equal to the threshold, the decoder 52, in a step 84, indicates that all of the LLRs for the bits in the erroneous symbol are to be modified, e.g., erased to zero.

In a step 86, the decoder 52 modifies all of the LLRs previously tagged for modification in step 84, and sends the code word and, for all of the bits in the code word, sends the corresponding LLRs as modified (if modified) to the ECC decoder 32.

Referring to FIGS. 4-6, alternate embodiments are contemplated. For example, the data path 44 may include components in addition to, or in substitution of, those shown, or one or more components of the data path may be omitted. Furthermore, although described as implementing a tensor-product code, the write-error encoder 48 may implement any code that is suitable for rendering write errors at least detectable, and the write-error decoder 52 may implement any suitable decoding technique that is compatible with the code implemented by the write-error encoder. Moreover, any operations of the encoder 48, decoder 52, or of the data path 44 in general may be performed in hardware, firmware, software, or in a combination or subcombination of hardware, firmware, and software. In addition, the steps described above may be performed in any suitable order, and any one or more of these steps may be omitted, or one or more other steps may be added. Furthermore, embodiments of the encoding and decoding techniques described above may be used in applications other than writing data to and reading data from a magnetic storage medium.

Figure 7:
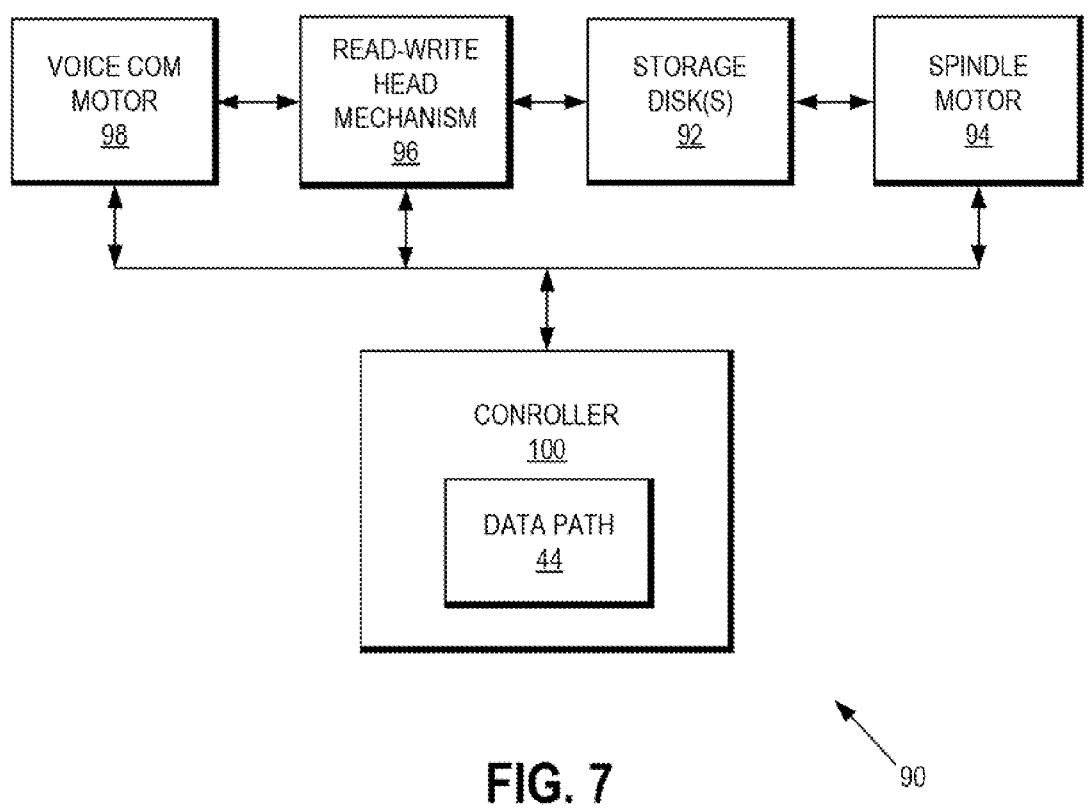
FIG. 7 is a block diagram of an embodiment of a storage-media drive that incorporates an embodiment of the data path of FIG. 4.

FIG. 7 is a block diagram of an embodiment of a media drive 90, which may incorporate an embodiment of the data path 44 of FIG. 4.

The media drive 90 includes at least one data-storage disk 92, which may be include a patterned storage medium such as the storage medium 36 of FIGS. 3 and 4, a spindle motor 94 for rotating the disk, a read-write head assembly 96 for holding the head over the disk surface, a voice coil motor 98 for moving the head assembly, and a controller 100 for controlling the spindle and voice-coil motors. At least one component of the data path 44 may be disposed on the controller 100, although at least the read-write head may be attached to the assembly 96 and remote from the controller. Alternatively, the controller 100 may be mounted on the assembly 96, and may even include the read-write head.

Figure 8:
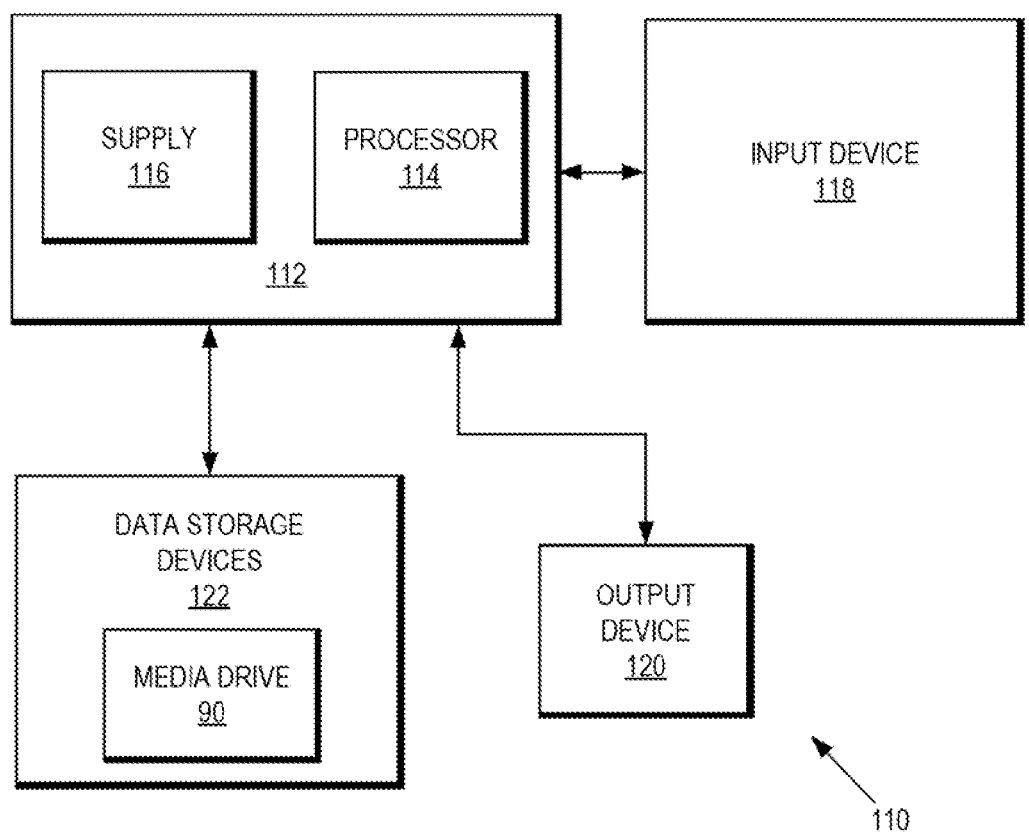
FIG. 8 is a block diagram of an embodiment of a system that incorporates an embodiment of the storage-media drive of FIG. 7.

FIG. 8 is a block diagram of a system 110 (here a computer system), which may incorporate an embodiment of the media drive 90 of FIG. 7.

The system 110 includes computer circuitry 112 for performing computer functions, such as executing software to perform desired calculations and tasks. The circuitry 112 typically includes a controller, processor, or one or more other integrated circuits (ICs) 114, and includes a power supply 116, which provides power at least to the IC(s) 114. One or more input devices 118, such as a keyboard or a mouse, are coupled to the computer circuitry 112 and allow an operator (not shown in FIG. 8) to manually input data thereto. One or more output devices 120 are coupled to the computer circuitry 112 to provide to the operator data generated by the computer circuitry. Examples of such output devices 120 include a printer and a video display unit. One or more data-storage devices 122, including the media drive 90, are coupled to the computer circuitry 112 to store data on or retrieve data from external storage media, such as the unpatterned storage medium 10 of FIG. 1 or the patterned storage medium 36 of FIGS. 3 and 4. Examples of the storage devices 122 and the corresponding storage media include drives that accept hard and floppy disks, tape cassettes, compact disk read-only memories (CD-ROMs), and digital-versatile disks (DVDs).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A data read path, comprising:
 a recovery circuit configured to recover coded data from a storage medium; and
 a decoder circuit coupled to the recovery circuit and configured to detect in the recovered data a write error that occurred during a writing of the coded data to the storage medium and to distinguish the write error from a read error based on a comparison of at least one log-likelihood ratio corresponding to the recovered data to a threshold.

2. The data read path of claim 1 wherein the decoder circuit is configured to determine a location of the write error within the recovered coded data.

3. The data read path of claim 1 wherein the decoder circuit is configured to correct the write error.

4. The data read path of claim 1 wherein:
 the recovered coded data includes at least one code word; and
 the decoder is configured to calculate at least one error locator that indicates a location of the write error within the at least one code word.

5. The data read path of claim 1 wherein:
 the recovered coded data includes at least one code word; and
 the decoder is configured to calculate at least one syndrome for the code word.

6. The data read path of claim 1 wherein:
 the recovered coded data includes at least one code word; and
 the decoder is configured:
 to calculate at least one syndrome for the code word; and
 to calculate at least one error locator, which indicates a location of the write error within the at least one code word, equal to a product of the at least one syndrome and at least one check value.

7. The data read path of claim 1 wherein:
 the recovered coded data includes at least one code word; and
 the decoder is configured:
 to calculate at least one syndrome for the code word; and
 to calculate at least one error locator, which indicates a location of the write error within the at least one code word, equal to a product of the at least one syndrome and at least one parity-check value.

8. The data read path of claim 1 wherein:
 the recovered coded data includes at least one code word;
 the recovery circuit is configured to generate a reliability value that indicates a probability that at least one portion of the at least one code word includes an error; and
 the decoder is configured:
 to calculate at least one error locator corresponding to the at least one portion of the at least one codeword; and to indicate that the at least one portion of the at least one code word includes the write error if the reliability value has a relationship to a threshold.

9. The data read path of claim 1 wherein:
the recovered coded data includes at least one code word;
the recovery circuit is configured to generate a reliability value that indicates a probability that at least one portion of the at least one code word includes an error; and
the decoder is configured:
to calculate at least one error locator corresponding to the at least one portion of the at least one codeword; and
to indicate that the at least one portion of the at least one code word does not include the write error if the reliability value has a relationship to a threshold.

10. The data read path of claim 1 wherein the recovery circuit comprises a soft-output Viterbi detector.

11. The data read path of claim 1 wherein the recovery circuit comprises a maximum-a-posteriori detector.

12. A data read path, comprising:
a recovery circuit configured to recover coded data from a storage medium; and
a decoder circuit coupled to the recovery circuit and configured to detect in the recovered data a write error that occurred during a writing of the coded data to the storage medium and to distinguish the write error from a read error;
wherein:
the recovered coded data includes at least one code word;
the recovery circuit is configured to generate a log-likelihood ratio that indicates a probability that at least one portion of the at least one code word includes a read error that occurred during the recovery of the coded data; and
the decoder is configured:
to calculate at least one error locator corresponding to the at least one portion of the at least one codeword; and
to indicate that the at least one portion of the at least one code word does not include the write error if the log-likelihood ratio is less than a threshold.

13. A data read path, comprising:
a recovery circuit configured to recover coded data from a storage medium; and
a decoder circuit coupled to the recovery circuit and configured to detect in the recovered data a write error that occurred during a writing of the coded data to the storage medium and to distinguish the write error from a read error;
wherein:
the recovered coded data includes at least one code word;
the recovery circuit is configured to generate a log-likelihood ratio that indicates a probability that at least one portion of the at least one code word includes a read error that occurred during the recovery of the coded data; and
the decoder is configured:
to calculate at least one error locator corresponding to the at least one portion of the at least one codeword; and
to indicate that the at least one portion of the at least one code word includes the write error if the log-likelihood ratio is greater than a threshold.

14. A data read path, comprising:
a recovery circuit configured to recover coded data from a storage medium; and
a decoder circuit coupled to the recovery circuit and configured to detect in the recovered data a write error that occurred during a writing of the coded data to the storage medium and to distinguish the write error from a read error;
wherein:
the recovered coded data includes at least one code word having at least one symbol;
the recovery circuit is configured to generate, for each member of the at least one symbol, a respective log-likelihood ratio that indicates a probability that the member includes a read error that occurred during the recovery of the coded data; and
the decoder is configured:
to calculate at least one error locator that indicates that the at least one symbol includes an error; and
to indicate that the at least one symbol includes the write error if a lowest of all of the log-likelihood ratios of the members of the at least one symbol is greater than a threshold.

15. A data read path, comprising:
a recovery circuit configured to recover coded data from a storage medium; and
a decoder circuit coupled to the recovery circuit and configured to detect in the recovered data a write error that occurred during a writing of the coded data to the storage medium and to distinguish the write error from a read error;
wherein:
the recovered coded data includes at least one code word having at least one symbol;
the recovery circuit is configured to generate, for each member of the at least one symbol, a respective log-likelihood ratio that indicates a probability that the member includes a read error that occurred during the recovery of the coded data; and
the decoder is configured:
to calculate at least one error locator that indicates that the at least one symbol includes an error;
to indicate that the at least one symbol includes the write error if a lowest of all of the log-likelihood ratios of the members of the at least one symbol is greater than a threshold; and
to set the log-likelihood ratios for all of the members of the at least one symbol to a predetermined value if the decoder has indicated that the at least one symbol includes the write error.

16. A data read path, comprising:
a recovery circuit configured to recover coded data from a storage medium; and
a decoder circuit coupled to the recovery circuit and configured to detect in the recovered data a write error that occurred during a writing of the coded data to the storage medium and to distinguish the write error from a read error;
wherein:
the recovered coded data includes at least one code word having at least one symbol;
the recovery circuit is configured to generate, for each member of the at least one symbol, a respective log-likelihood ratio that indicates a probability that the member includes a read error that occurred during the recovery of the coded data; and
the decoder is configured:
to calculate at least one error locator that indicates that the at least one symbol includes an error; and
to indicate that the at least one symbol does not include the write error if a lowest of all of the log-likelihood ratios of the members of the at least one symbol is less than a threshold.

17. A media-drive controller, comprising:
a data-write path configured to write coded data to a storage medium; and
a data read path, comprising:
a recovery circuit configured to recover the coded data from the storage medium; and
a decoder circuit coupled to the recovery circuit and configured to detect in the recovered data a write error that occurred during the writing of the coded data to the storage medium and distinguish the write error from a read error based on a comparison of at least one log-likelihood ratio corresponding to the recovered data to a threshold.

18. A media drive, comprising:
a storage medium configured to store coded data; and
a media-drive controller, comprising:
a data write path configured to write the coded data to the storage medium; and
a data read path, comprising:
a recovery circuit configured to recover the coded data from the storage medium; and
a decoder circuit coupled to the recovery circuit and configured to detect in the recovered data a write error that occurred during the writing of the coded data to the storage medium and distinguish the write error from a read error based on a comparison of at least one log-likelihood ratio corresponding to the recovered data to a threshold.

19. The media drive of claim 18, wherein the storage medium comprises a bit-patterned storage medium.

20. The media drive of claim 18, wherein the storage medium comprises a magnetic bit-patterned storage medium.

21. A system, comprising:
a media drive, comprising:
a storage medium configured to store coded data; and
a media-drive controller, comprising:
a data write path configured to write the coded data to the storage medium; and
a data read path, comprising:
a recovery circuit configured to recover the coded data from the storage medium;
a decoder circuit coupled to the recovery circuit and configured to detect in the recovered data a write error that occurred during the writing of the coded data to the storage medium and distinguish the write error from a read error based on a comparison of at least one log-likelihood ratio corresponding to the recovered data to a threshold; and
an integrated circuit coupled to the media drive.

22. The system of claim 21 wherein the integrated circuit comprises a processor.

23. The system of claim 21 wherein the media-drive controller and the integrated circuit are disposed on a same integrated-circuit die.

24. The system of claim 21 wherein the media-drive controller and the integrated circuit are disposed on respective integrated-circuit dies.

25. A method, comprising:
recovering coded data from a storage medium;
detecting in the recovered data an error that potentially occurred during a writing of the coded data to the storage medium; and
distinguishing the error to be a write error as opposed to a read error based on a comparison of at least one loci-likelihood ratio corresponding to the recovered data to a threshold.

26. The method of claim 25, further comprising determining a location of the error within the recovered coded data.

27. The method of claim 25, further comprising correcting the error.

28. The method of claim 25, further comprising:
wherein recovering the coded data comprises recovering at least one code word; and
calculating at least one error locator that indicates a location of the error within the at least one code word.

29. The method of claim 25, further comprising:
wherein recovering the coded data includes recovering at least one code word; and
calculating at least one syndrome for the code word.

30. The method of claim 25, further comprising:
wherein recovering the coded data comprises recovering at least one code word;
calculating at least one syndrome for the code word; and
calculating at least one error locator, which indicates a location of the error within the at least one code word, equal to a product of the at least one syndrome and at least one check value.

31. The method of claim 25, further comprising:
wherein recovering the coded data comprises recovering at least one code word;
calculating at least one syndrome for the code word; and
calculating at least one error locator, which indicates a location of the error within the at least one code word, equal to a product of the at least one syndrome and at least one parity-check value.

32. The method of claim 25, further comprising:
wherein recovering the coded data includes recovering at least one code word;
generating a reliability value that indicates a probability that at least one portion of the at least one code word is erroneous;
calculating an error locator that indicates that the at least one portion of the at least one codeword includes the error; and
indicating that the error is a write error if the reliability value has a relationship to a threshold.

33. The method of claim 25, further comprising:
wherein recovering the coded data comprises recovering at least one code word;
generating a reliability value that indicates a probability that at least one portion of the at least one code word is erroneous;
calculating at least one error locator that indicates that the at least one portion of the at least one codeword includes the error; and
indicating that the error is not a write error if the reliability value has a relationship to a threshold.

34. A method, comprising:
recovering coded data from a storage medium;
detecting in the recovered data an error that potentially occurred during a writing of the coded data to the storage medium; and
distinguishing the error to be a write error as opposed to a read error;
wherein recovering the coded data comprises recovering at least one code word;
generating a log-likelihood ratio that indicates a probability that at least one portion of the at least one code word includes a read error that occurred during the recovery of the coded data;

calculating at least one error locator that indicates that the at least one portion of the at least one codeword includes the detected error; and indicating that the detected error is not a write error if the log-likelihood ratio is less than a threshold.

35. A method, comprising:

recovering coded data from a storage medium;

detecting in the recovered data an error that potentially occurred during a writing of the coded data to the storage medium; and distinguishing the error to be a write error as opposed to a read error;

wherein recovering the coded data comprises recovering at least one code word;

generating a log-likelihood ratio that indicates a probability that at least one portion of the at least one code word includes a read error that occurred during the recovery of the coded data;

calculating at least one error locator that indicates that the at least one portion of the at least one codeword includes the detected error; and indicating that the detected error is a write error if the log-likelihood ratio is greater than a threshold.

36. A method, comprising:

recovering coded data from a storage medium;

detecting in the recovered data an error that potentially occurred during a writing of the coded data to the storage medium; and distinguishing the error to be a write error as opposed to a read error;

wherein recovering the coded data comprises recovering at least one symbol of at least one code word;

generating, for each member of the at least one symbol, a respective log-likelihood ratio that indicates a probability that the member includes a read error that occurred during the recovery of the coded data;

calculating at least one error locator that indicates that the at least one symbol includes the detected error; and indicating that the detected error is a write error if a lowest of all of the log-likelihood ratios of the members of the at least one symbol is greater than a threshold.

37. A method, comprising:

recovering coded data from a storage medium;

detecting in the recovered data an error that potentially occurred during a writing of the coded data to the storage medium; and distinguishing the error to be a write error as opposed to a read error;

wherein recovering the coded data comprises recovering at least one symbol of at least one code word;

generating, for each member of the at least one symbol, a respective log-likelihood ratio that indicates a probability that the member includes a read error that occurred during the recovery of the coded data;

calculating at least one error locator that indicates that the at least one symbol includes the detected error;

indicating that the detected error is a write error if a lowest of all of the log-likelihood ratios of the members of the at least one symbol is greater than a threshold; and setting the log-likelihood ratios for all of the members to a predetermined value in response to indicating that the detected error is a write error.

38. A method, comprising:

recovering coded data from a storage medium;

detecting in the recovered data an error that potentially occurred during a writing of the coded data to the storage medium; and distinguishing the error to be a write error as opposed to a read error;

wherein recovering the coded data comprises recovering at least one symbol of at least one code word;

the recovery circuit is configured to generate, for each member of the at least one symbol, a respective log-likelihood ratio that indicates a probability that the member includes a read error that occurred during the recovery of the coded data;

calculating at least one error locator that indicates that the at least one symbol includes the detected error; and indicating that the detected error is not a write error if a lowest of all of the log-likelihood ratios of the members of the at least one symbol is less than a threshold.

\* \* \* \* \*

UNITED STATES PATENT AND TRADEMARK OFFICE
CERTIFICATE OF CORRECTION

PATENT NO. : 8,745,466 B2
APPLICATION NO. : 12/852397
DATED : June 3, 2014
INVENTOR(S) : Mustafa N. Kaynak, Alessandro Risso and Patrick R. Khayat It is certified that error appears in the above-identified patent and that said Letters Patent is hereby corrected as shown below:

IN THE CLAIMS:

Claim 25, Column 13, line 65, the phrase "read error based on a comparison of at least one loci-likelihood" should read --read error based on a comparison of at least one log-likelihood--

Signed and Sealed this
Twenty-third Day of December, 2014

Michelle K. Lee
*Deputy Director of the United States Patent and Trademark Office*